United States Patent [19]
Kim

[11] Patent Number: 4,996,672
[45] Date of Patent: Feb. 26, 1991

[54] SELECTING CIRCUIT FOR A MEMORY OPERATING MODE

[75] Inventor: Moon G. Kim, Sihung-dong, Rep. of Korea

[73] Assignee: Samsung Electronics Co., Ltd., Suwon, Rep. of Korea

[21] Appl. No.: 290,990

[22] Filed: Dec. 28, 1988

[30] Foreign Application Priority Data

Apr. 23, 1988 [KR] Rep. of Korea .................. 88-4649

[51] Int. Cl.$^5$ .............................................. G11C 7/00
[52] U.S. Cl. .............................................. 365/225.7
[58] Field of Search ................................. 365/225.7

[56] References Cited

U.S. PATENT DOCUMENTS 4,833,650  5/1989  Hirayama et al. ............... 365/225.7

Primary Examiner—James W. Moffitt
Attorney, Agent, or Firm—Ladas & Parry

[57] ABSTRACT

In a selecting circuit for a memory operating mode, the circuit has a mode enable pulse generator which produces a short pulse for a mode enable pulse. A mode selecting clock generator which receives a mode enable pulse and selects a memory operating mode. The number of the mode selecting clock generator is determined by the number of memory operating mode to be used. A fuse, coupled with each of the mode selecting clock generators, is out when the corresponding mode selecting generator is selected and hence produces a mode selecting signal.

2 Claims, 2 Drawing Sheets

SELECTING CIRCUIT FOR A MEMORY OPERATING MODE

BACKGROUND OF THE INVENTION

This invention relates to a selecting circuit for a memory operating mode which makes it easy to select an operating mode such as the modes of past page, static column, and nibble.

Several conventional methods have been used to select an operating mode such as the metal layer option method and the bonding option method. For the metal layer option method, it needs different mask steps for each operating mode so that the increase in the number of metal layer causes to be increased both the complexity in the manufacturing and assembly processes, and the cost.

In addition, the bonding option method makes it possible to decrease the number of metal layers, whereas an layout area and the complexity of assembly process are increased because of the rise in the number of the bonding pads.

SUMMARY OF THE INVENTION

It is an object of the invention to provide a selecting circuit for a memory operating mode according to which an option of each operating mode with the cutting of a programmed fuse causes an yield to increase by the result of a simple manufacturing and assembly.

It is another object of the invention to provide an selecting circuit for a memory operating mode in which each mode selecting circuit composed of one fuse and a mode selecting control clock generator with a simple logic make the dimension of a chip small.

In the selecting circuit for a memory operating mode according to the present invention, a corresponding mode is selected at the time of the input of a mode enable pulse with a fuse connected to each of a mode selecting clock generator and by cutting the fuse in the corresponding mode selecting clock generator.

DETAILED DESCRIPTION OF THE PREFERRED EMBODIMENT

The circuit of the present invention will now be described with reference to the accompanying drawings.

Figure 1:
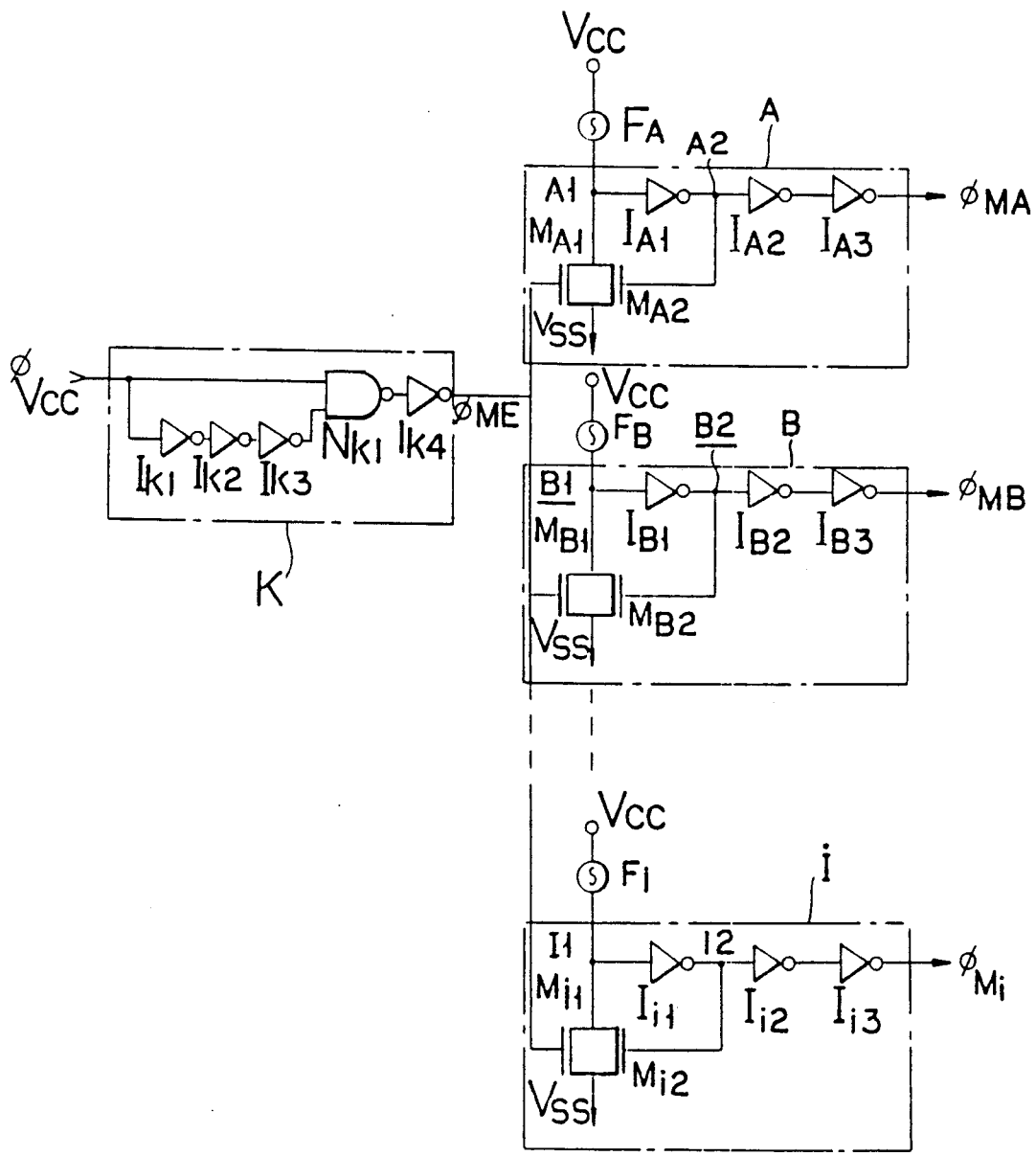
FIG. 1 is a selecting circuit for a memory operating mode according to the invention.

As shown in FIG. 1, a $V_{cc}$ related clock $\phi V_{cc}$ is connected to be applied in common to each of mode selecting clock generators A, B, . . . , and I through a mode enable pulse generator K, and each of mode selecting clocks $\phi MA$, $\phi MB$, . . . , and $\phi MI$ is connected to be produced by a corresponding fuse being coupled with said respective mode selecting clock generator. Here, $\phi V_{cc}$ is enabled when a $V_{cc}$ is active.

The mode enable pulse generator K comprises four inverters $I_{K1}$-$I_{K4}$ and a NAND gate $N_{K1}$. This circuit arrangement produces a short pulse for a mode enable pulse $\phi ME$ when the $\phi V_{cc}$ is enabled.

The mode selecting clock generator A comprises three inverters $I_{A1}$-$I_{A3}$ and two transistors $M_{A1}$ and $M_{A2}$. In this circuit arrangement, if the fuse $F_A$ is cut, the mode selecting clock $\phi MA$ is enabled. The other mode selecting clock generators B, C, . . . and I have the same circuit configuration as the mode selecting clock generator A.

Figure 2:
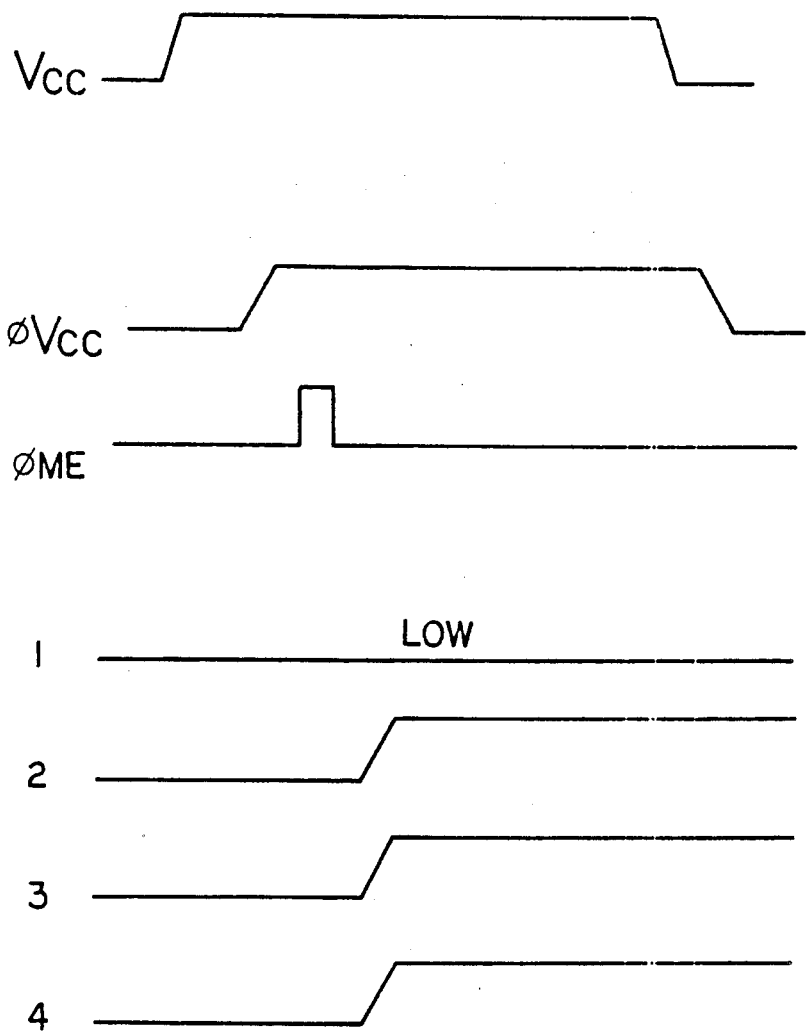
FIG. 2 is a graphical representation illustrating output waveforms at each section of FIG. 1.

The operation of the circuit will now be explained with reference to FIG. 2. As shown in FIG. 2, with the activation of power supply voltage $V_{cc}$, $\phi V_{cc}$ is enabled. This $\phi V_{cc}$ is generated a mode enable pulse generator K. The consumption of currents can be minimized at the time of a high level of a pulse output as the mode enable pulse $\phi ME$ has a short width of pulse.

Let us consider a basic mode. The basic mode is a state having a non-cutting fuse for all fuses $F_A$, $F_B$, . . . and $F_I$. For the basic mode, all the mode selecting clocks $\phi MA$, $\phi MB$, . . . , and $\phi MI$ keep up disable states regardless of the inputting of the mode enable pulse $\phi ME$. At this time, in a basic mode, there may be happened to a current path between the supply voltages $V_{cc}$ and $V_{ss}$ as the result of the turn-on of the transistors $M_{A1}$, $M_{B1}$, . . . , and $M_{I1}$ due to the mode enable pulse $\phi ME$. This current path can be neglected because the pulse width of the mode enable pulse $\phi ME$ is short and the transistors $M_{A1}$, $M_{B1}$, . . . , and $M_{I1}$ having a long channel length are used.

For using the selecting clock generator A, the fuse $F_A$ is cut. When the mode enable pulse is a high level, a node A1 is in a disable state and the state of a node A2 is high through the transistors $M_{A1}$ and $M_{A2}$. The transistor $M_{A2}$ plays the role of latching the node A1. Therefore, the mode selecting signal $\phi MA$ is enabled so that this clock controls a corresponding operating mode.

To select the mode selecting clock generator B or I for the option of a corresponding node, the operation is the same as described above for the selecting clock generator A.

In the circuit arrangement according to the present invention, the number of fuses and the mode selecting clock generator varies with the number of option modes. For example, we consider a dynamic RAM that needs to select three modes of a fast page mode, a static column mode, and a nibble mode. With the fast page mode set as the basic mode, a pair of mode selecting clock generators and a pair of mode selecting clock generators and a pair of fuses are needed. At the state in which all the fuses are non-cutting, the selecting circuit operates as a basic mode for the fast page. The option for the static column mode or the nibble mode is carried out by cutting the fuse in the corresponding mode selecting clock generator.

As the circuit according to the present invention which selects an option mode by using the fuse and the simple logic circuit, both the simplication of the manufacturing and assembly process, and the cost reduction are obtained. In addition, the degrees of intergration can be improved with the simplicity of the circuit configuration.

The invention is in no way limited to the example described hereinabove. Various modifications of the disclosed embodiment, as well as other embodiments of the invention, will become apparent to persons skilled in the art upon reference of the description of the invention. It is therefore contemplated that the appended claims will cover any such modifications or embodiments as fall within the true scope of the invention.

What is claimed is:

1. A selecting circuit for a memory operating mode comprising: a mode enable pulse generator;

a plurality of mode selecting clock generators arranged to receive a mode enable pulse from said mode enable pulse generator; and a plurality of fuses connected, one by one, to each of the mode selecting clock generators, each of said mode selecting clock generators comprising three inverters and two nodes in which a first of said nodes is connected to the corresponding fuse and to a first inverter of said three inverters and to a pair of transistors, the second of said nodes being connected to the second transistor of said pair of transistors, and the first of said transistors of said transistor pair being connected to receive a mode enable pulse.

2. A selecting circuit for a memory operating mode as claimed in claim 1 wherein, in each of said clock generators, said first node is disabled and said second node is enabled when the corresponding fuse is cut, and said second transistor latches the disabled state at said first node, whereby an operating mode corresponding to the mode selecting clock generator having the cut fuse is selected.

* * * * *